United States Patent
Plesski et al.

(10) Patent No.: US 10,985,728 B2
(45) Date of Patent: Apr. 20, 2021

(54) TRANSVERSELY-EXCITED FILM BULK ACOUSTIC RESONATOR AND FILTER WITH A UNIFORM-THICKNESS DIELECTRIC OVERLAYER

(71) Applicant: Resonant Inc., Goleta, CA (US)

(72) Inventors: Viktor Plesski, Gorgier (CH); Jesson John, Dublin, CA (US); Bryant Garcia, Burlingame, CA (US)

(73) Assignee: Resonant Inc., Austin, TX (US)

( * ) Notice: Subject to any disclaimer, the term of this patent is extended or adjusted under 35 U.S.C. 154(b) by 0 days.

(21) Appl. No.: 17/030,050

(22) Filed: Sep. 23, 2020

(65) Prior Publication Data

US 2021/0028756 A1    Jan. 28, 2021

Related U.S. Application Data

(63) Continuation-in-part of application No. 16/920,173, filed on Jul. 2, 2020, which is a continuation of
(Continued)

(51) Int. Cl.
*H03H 9/02* (2006.01)
*H03H 9/17* (2006.01)
(Continued)

(52) U.S. Cl.
CPC .......... *H03H 9/02228* (2013.01); *H03H 3/04* (2013.01); *H03H 9/02031* (2013.01);
(Continued)

(58) Field of Classification Search
CPC ...... H03H 9/02228; H03H 3/04; H03H 9/568; H03H 9/02031; H03H 9/564; H03H 9/132;
(Continued)

(56) References Cited

U.S. PATENT DOCUMENTS

| 6,540,827 B1 | 4/2003 | Levy et al. |
| 7,463,118 B2 | 12/2008 | Jacobsen |

(Continued)

FOREIGN PATENT DOCUMENTS

| WO | 2016017104 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Rakesh B Patel
*Assistant Examiner* — Jorge L Salazar, Jr.
(74) *Attorney, Agent, or Firm* — Socal IP Law Group LLP; John E. Gunther

(57) ABSTRACT

Acoustic filters, resonators and methods are disclosed. An acoustic filter device includes a substrate having a surface and a single-crystal piezoelectric plate having front and back surfaces and a thickness ts, the back surface attached to the surface of the substrate except for portions of the piezoelectric plate forming a plurality of diaphragms that span respective cavities in the substrate. A conductor pattern is formed on the front surface of the piezoelectric plate, the conductor pattern comprising a plurality of interdigital transducers (IDTs) of a plurality of acoustic resonators, interleaved fingers of each IDT of the plurality of IDTs disposed on a respective diaphragm of the plurality of diaphragms. Zero or more dielectric layers are deposited over all of the IDTs and the diaphragms, wherein a total thickness of the zero or more dielectric layers is the same for all of the plurality of acoustic resonators.

17 Claims, 11 Drawing Sheets

Related U.S. Application Data application No. 16/438,121, filed on Jun. 11, 2019, now Pat. No. 10,756,697, which is a continuation-in-part of application No. 16/230,443, filed on Dec. 21, 2018, now Pat. No. 10,491,492.

(60) Provisional application No. 62/904,233, filed on Sep. 23, 2019, provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.
   *H03H 3/04* (2006.01)
   *H03H 9/13* (2006.01)
   *H03H 9/56* (2006.01)
   *H03H 3/02* (2006.01)

(52) U.S. Cl.
   CPC ............ *H03H 9/132* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01); *H03H 2003/0442* (2013.01)

(58) Field of Classification Search
   CPC ........ H03H 9/174; H03H 9/176; H03H 9/562; H03H 2003/023; H03H 2003/0442
   USPC .......................................... 333/133, 193–196
   See application file for complete search history.

(56) References Cited

U.S. PATENT DOCUMENTS

| | | | |
|---|---|---|---|
| 7,535,152 B2 | 5/2009 | Ogami et al. | |
| 7,684,109 B2 | 3/2010 | Godshalk et al. | |
| 7,868,519 B2 | 1/2011 | Umeda | |
| 8,278,802 B1 | 10/2012 | Lee et al. | |
| 8,829,766 B2 | 9/2014 | Milyutin et al. | |
| 8,932,686 B2 | 1/2015 | Hayakawa et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 * | 8/2017 | Kando | H03H 9/25 |
| 9,780,759 B2 | 10/2017 | Kimura et al. | |
| 2002/0158714 A1 | 10/2002 | Kaitila et al. | |
| 2004/0261250 A1 | 12/2004 | Kadota et al. | |
| 2011/0109196 A1 | 5/2011 | Goto | |
| 2013/0234805 A1 | 9/2013 | Takahashi | |
| 2014/0145556 A1 | 5/2014 | Kadota | |
| 2014/0151151 A1 | 6/2014 | Reinhardt | |
| 2015/0319537 A1 | 11/2015 | Perois et al. | |
| 2015/0333730 A1 | 11/2015 | Meltaus | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2019/0068164 A1 | 2/2019 | Houlden et al. | |
| 2019/0131953 A1 | 5/2019 | Gong | |
| 2019/0273480 A1 | 9/2019 | Lin | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

* cited by examiner

TRANSVERSELY-EXCITED FILM BULK ACOUSTIC RESONATOR AND FILTER WITH A UNIFORM-THICKNESS DIELECTRIC OVERLAYER

RELATED APPLICATION INFORMATION

This patent claims priority from provisional patent application 62/904,233, filed Sep. 23, 2019, entitled XBAR FILTERS USING RESONATORS WITH SMALL PITCHES TO ACHIEVE FREQUENCY SEPARATION. This patent is a continuation-in-part of application Ser. No. 16/920,173, titled TRANSVERSELY-EXCITED FILM BULK ACOUSTIC RESONATOR, filed Jul. 2, 2020, which is a continuation of application Ser. No. 16/438,121 titled TRANSVERSELY-EXCITED FILM BULK ACOUSTIC RESONATOR, filed Jun. 11, 2019, now U.S. Pat. No. 10,756,697, which is a continuation-in-part of application Ser. No. 16/230,443, entitled TRANSVERSELY-EXCITED FILM BULK ACOUSTIC RESONATOR, filed Dec. 21, 2018, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application. RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
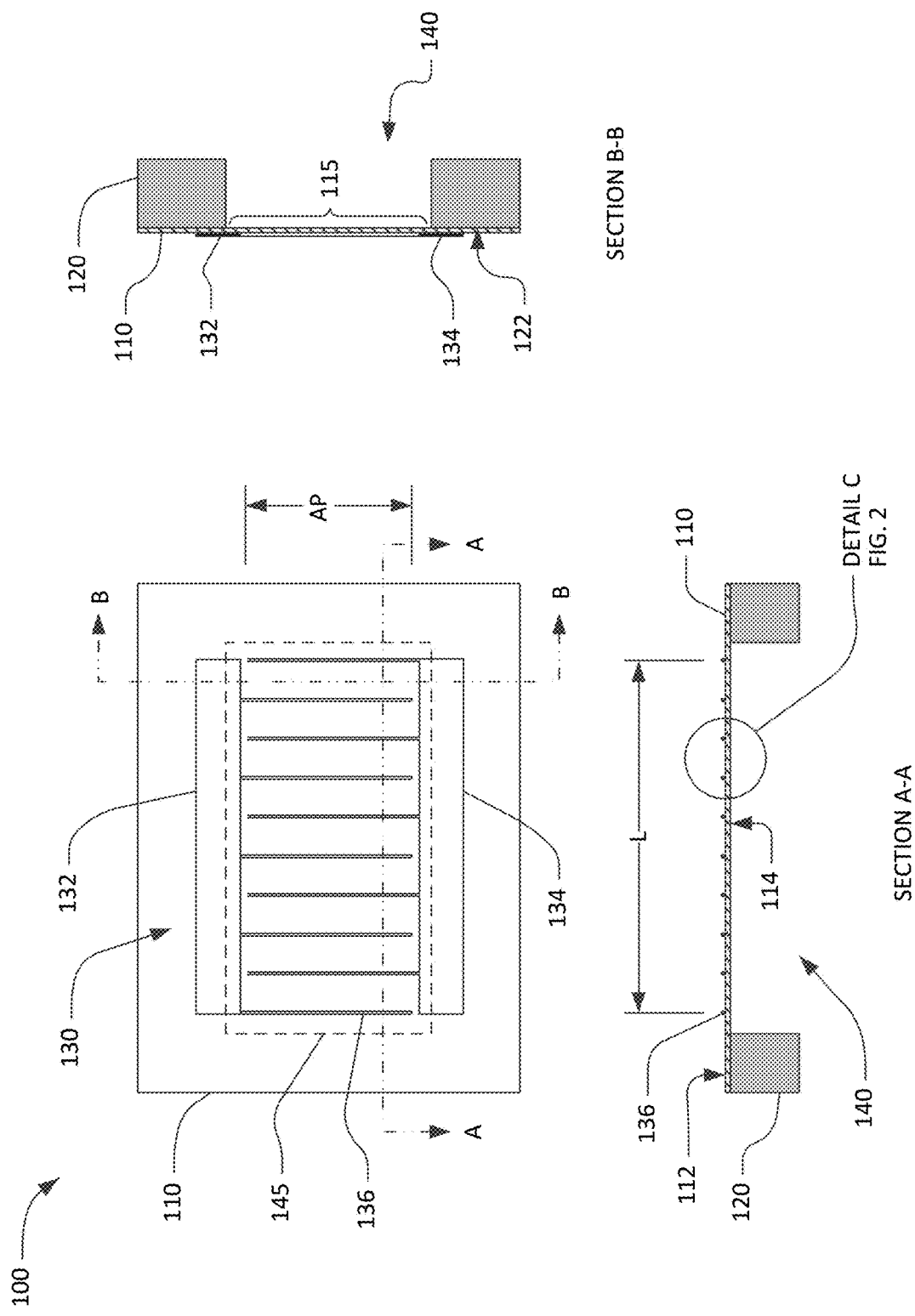
FIG. 1 has a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front surface 112 and back surface 114. However, XBARs may be fabricated on piezoelectric plates with other crystallographic orientations including rotated Z-cut and rotated YX-cut.

The back surface 114 of the piezoelectric plate 110 is attached to a surface 122 of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3A and FG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have hundreds, possibly thousands, of parallel fingers in the IDT 110. Similarly, the thickness of the fingers in the cross-sectional views is greatly exaggerated in the drawings.

Figure 2:
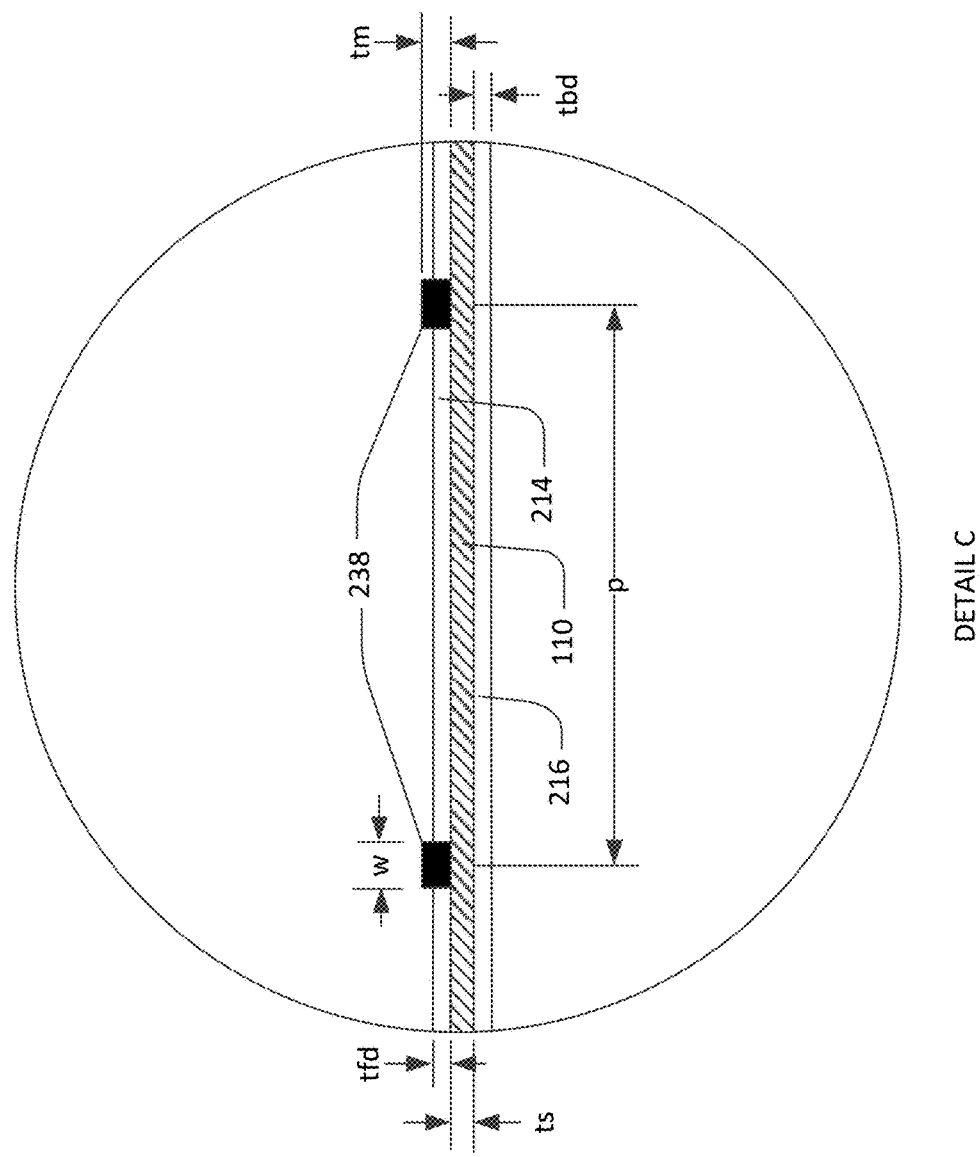
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness $t_s$. $t_s$ may be, for example, 100 nm to 1500 nm. When used in filters for LTE™ bands from 3.4 GHZ to 6 GHz (e.g. bands 42, 43, 46), the thickness $t_s$ may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum, a substantially aluminum alloys, copper, a substantially copper alloys, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 2, the IDT fingers 238 have rectangular cross-sections. The IDT fingers may have some other cross-sectional shape, such as trapezoidal.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
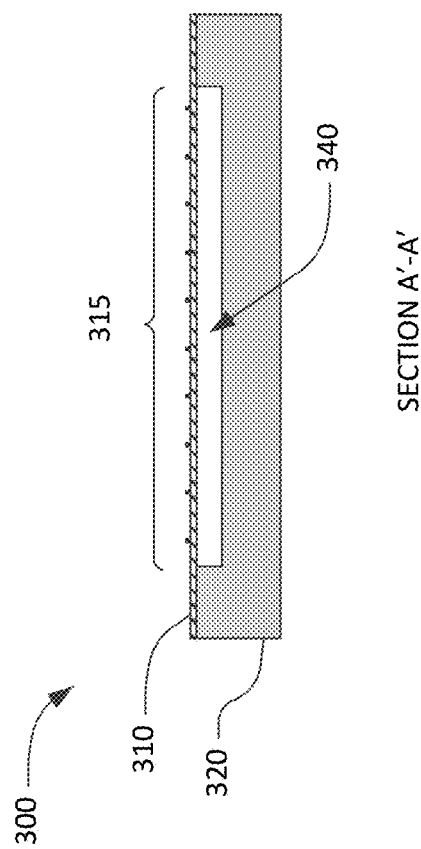
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter 345 of the cavity 340.

Figure 4:
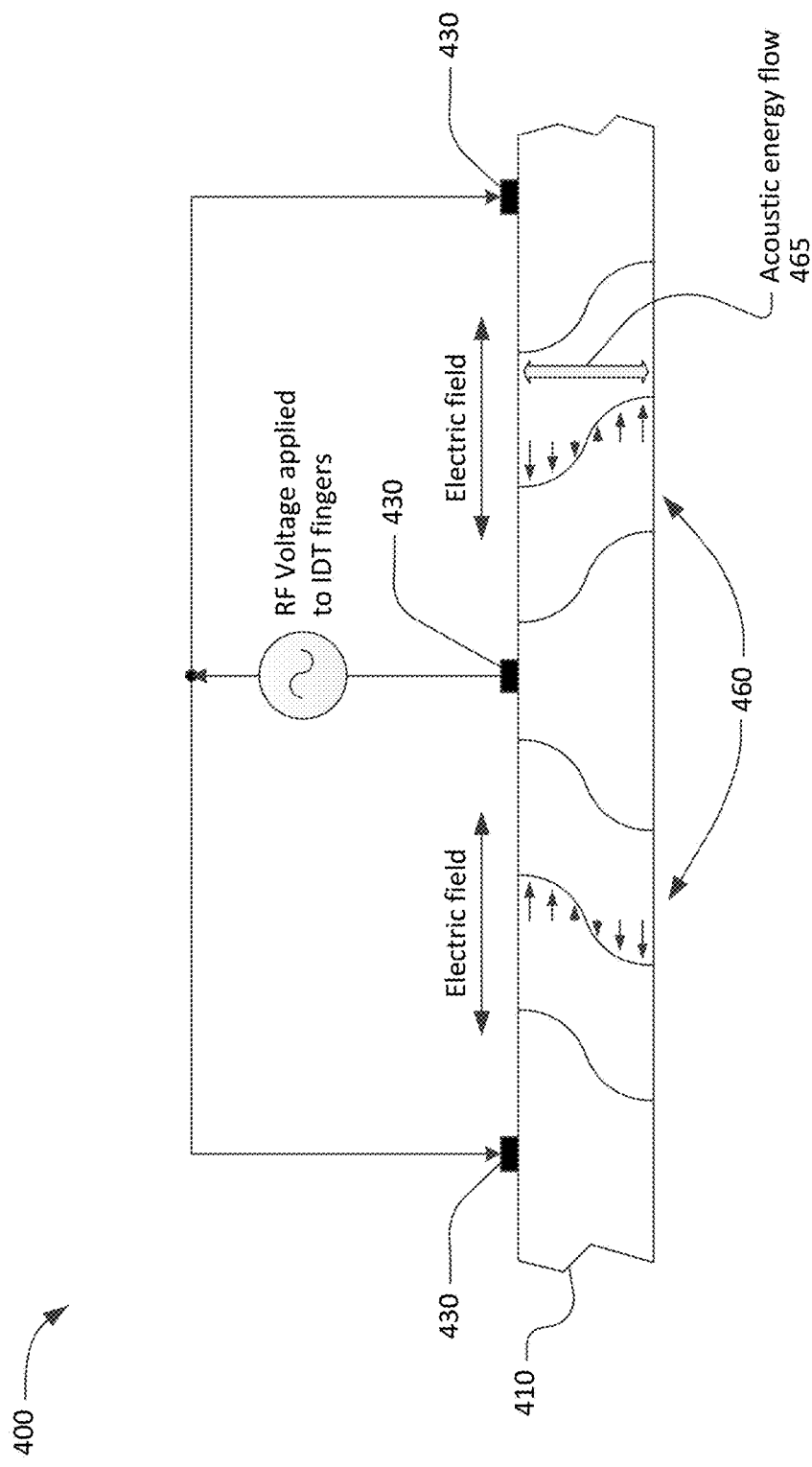
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
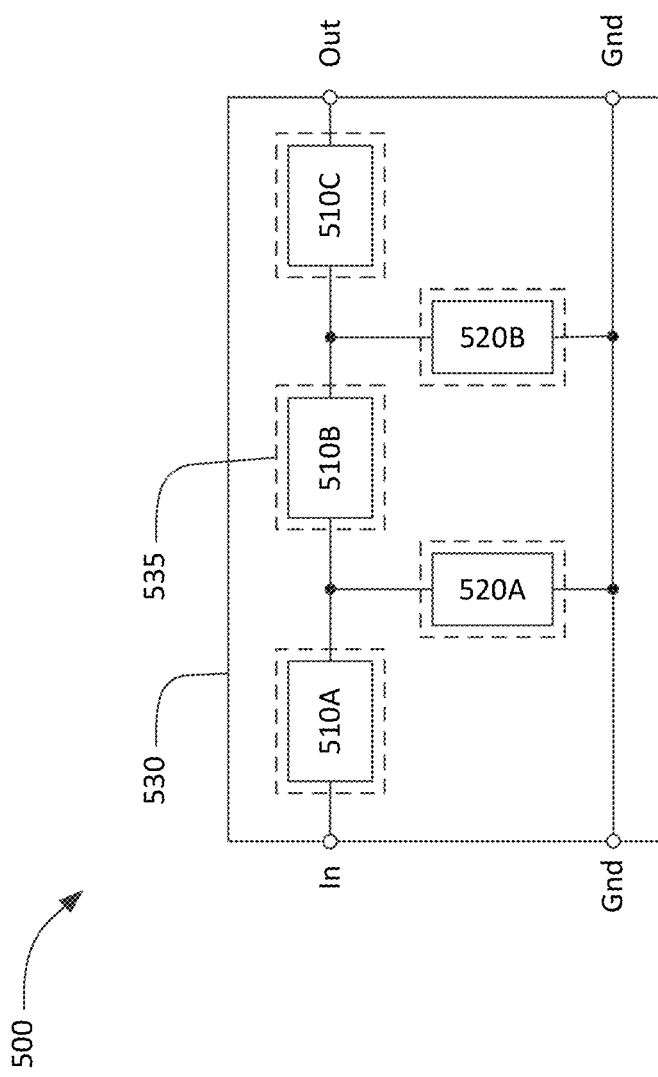
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Figure 6:
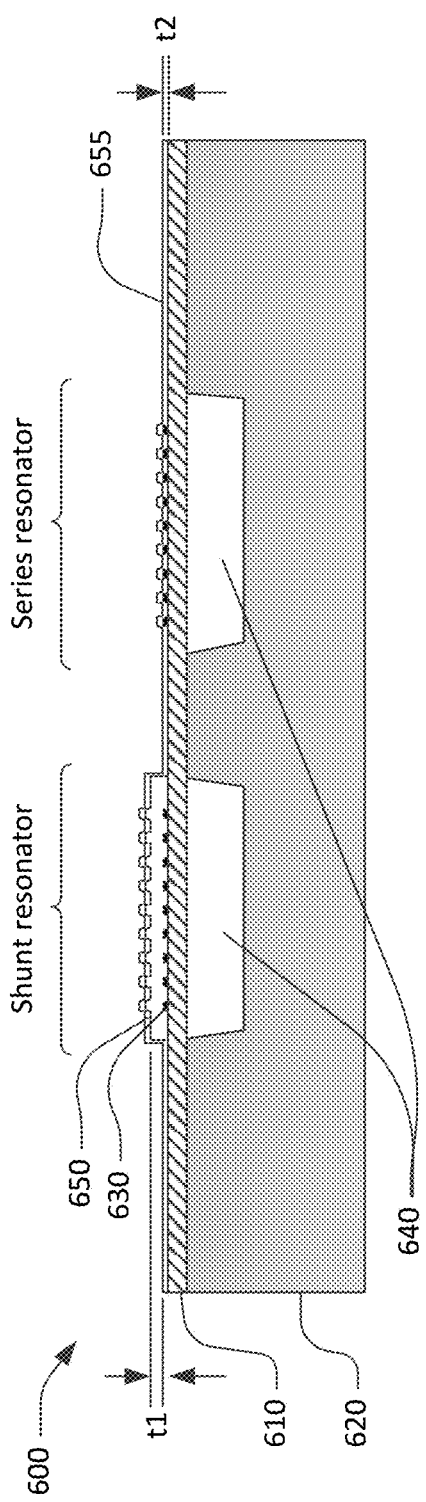
FIG. 6 is a schematic cross-sectional view of two XBARs illustrating a frequency-setting dielectric layer.

FIG. 6 is a schematic cross-sectional view through a shunt resonator and a series resonator of a filter 600 that uses a dielectric frequency setting layer to separate the resonance frequencies of shunt and series resonators. A piezoelectric plate 610 is attached to a substrate 620. Portions of the piezoelectric plate 610 form diaphragms spanning cavities 640 in the substrate 620. Interleaved IDT fingers, such as finger 630, are formed on the diaphragms. A first dielectric layer 650, having a thickness t1, is formed over the IDT of the shunt resonator. The first dielectric layer 650 is considered a "frequency setting layer", which is a layer of dielectric material applied to a first subset of the resonators in a filter to offset the resonance frequencies of the first subset of resonators with respect to the resonance frequencies of resonators that do not receive the dielectric frequency setting layer. The dielectric frequency setting layer is commonly $SiO_2$ but may be silicon nitride, aluminum oxide, or some other dielectric material. The dielectric frequency setting layer may be a laminate or composite of two or more dielectric materials.

A second dielectric layer 655, having a thickness t2, may be deposited over both the shunt and series resonator. The second dielectric layer 655 serves to seal and passivate the surface of the filter 600. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 600. Thus, the second dielectric layer can be referred to as the "passivation and tuning layer".

The resonance frequency of an XBAR is roughly proportional to the inverse of the total thickness of the diaphragm including the piezoelectric plate 610 and the dielectric layers 650, 655. The diaphragm of the shunt resonator is thicker than the diaphragm of the series resonator by the thickness t1 of the dielectric frequency setting layer 650. Thus, the shunt resonator will have a lower resonance frequency than the series resonator. The difference in resonance frequency between series and shunt resonators is determined by the thickness t1.

U.S. Pat. No. 10,637,438 describes XBAR resonators for use in high power applications. For such applications, the conductors of the IDT are very thick to remove heat from the resonator diaphragm. The conductors may be, for example, aluminum with a thickness between 0.85 times the diaphragm thickness and 2.5 times the diaphragm thickness. With such thick conductors, the preferred range for the pitch of the IDT fingers is from 6 times the diaphragm thickness to 12.5 times the diaphragm thickness. Varying the pitch of the IDT fingers over this range allows tuning the resonance frequency of an XBAR over a limited range. The resonance frequency of an XBAR with a pitch equal to 6 times the diaphragm thickness is about 4.5% higher than the resonance frequency of an XBAR with a pitch equal to 12.5 times the diaphragm thickness.

U.S. Pat. No. 10,637,438 also describes the use of a figure of merit (FOM) to define a design space (i.e. combinations of IDT conductor thickness, pitch and width) that provides XBARs with acceptable performance for use in filters. The FOM is calculated by integrating the negative impact of spurious modes across a defined frequency range. For each combination of IDT conductor thickness and pitch, the FOM is calculated for a range of IDT finger widths. The minimum FOM value over the range of IDT finger widths is considered the minimized FOM for that conductor thickness/pitch combination. The definition of the FOM and the frequency range depend on the requirements of a particular filter. The frequency range typically includes the passband of the filter and may include one or more stop bands. Spurious modes occurring between the resonance and anti-resonance frequencies of each hypothetical resonator may be accorded a heavier weight in the FOM than spurious modes at frequencies below resonance or above anti-resonance. Hypothetical resonators having a minimized FOM below a threshold value were considered potentially "useable", which is to say probably having sufficiently low spurious modes for use in a filter. Hypothetical resonators having a minimized cost function above the threshold value were considered not useable.

FOM calculations showed that useable resonators were possible over a wide range of IDT pitch for relatively thin IDT conductors in a thickness range of 50 nm to 150 nm. Such resonators may not be suitable for high power applications but may be useful for filters in receive-only communications channels and other applications.

Figure 7:
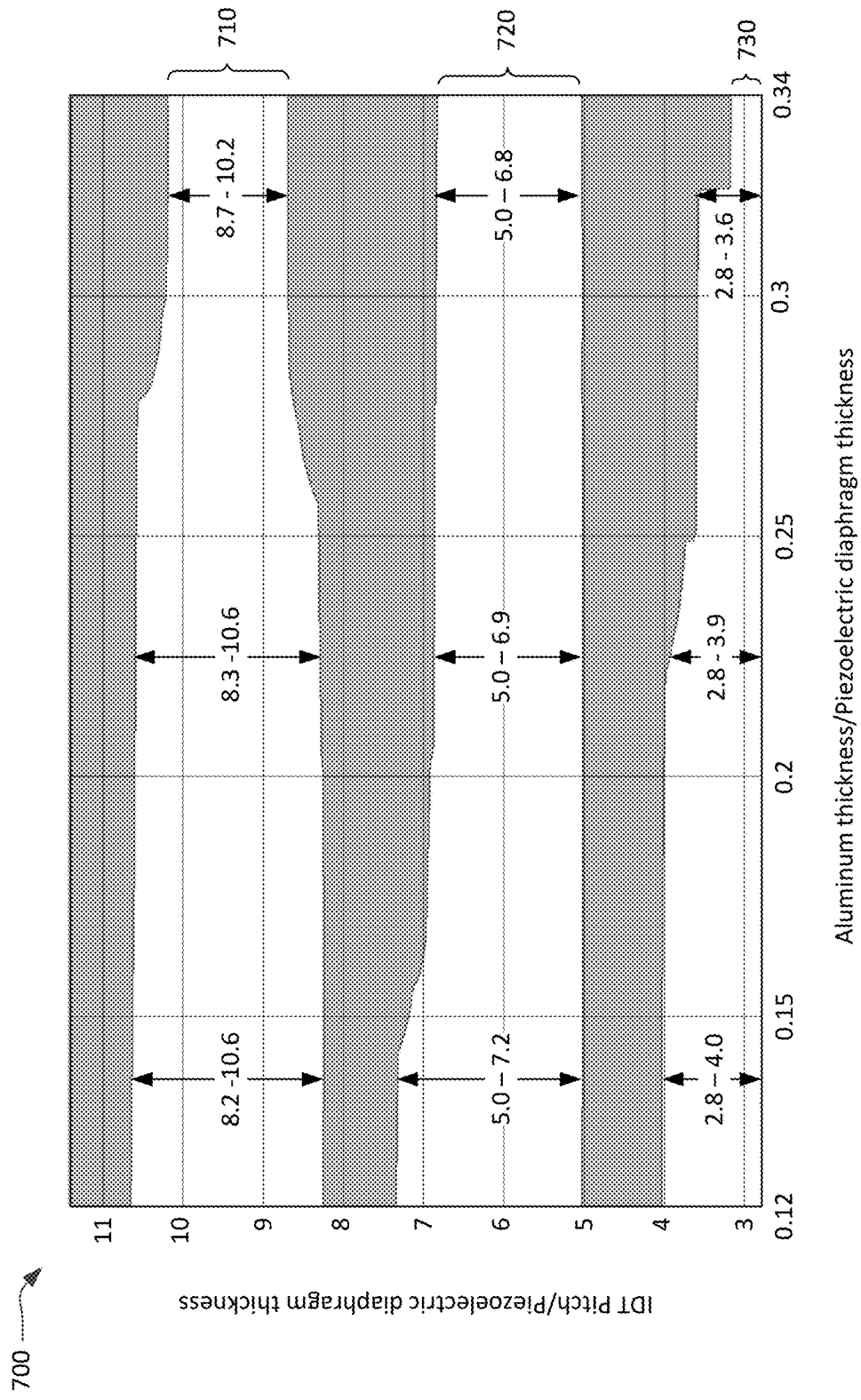
FIG. 7 is a graph identifying preferred combinations of aluminum IDT thickness and IDT pitch for XBARs with thin aluminum conductors.

FIG. 7 is a chart 700 showing combinations of IDT pitch and IDT finger thickness that may provide useable resonators. Both IDT pitch and IDT finger thickness are normalized to the thickness of the diaphragm. This chart is based on two-dimensional simulations of XBARs with lithium niobate diaphragms, aluminum conductors, no dielectric tuning layer, and a typical passivation layer. XBARs with IDT pitch and thickness within unshaded regions 710, 720, 730 are likely to have sufficiently low spurious effects for use in filters. XBARs with IDT pitch and thickness within the intervening shaded regions have unacceptably high spurious modes for use in the target filter. With IDT conductor thickness less than 0.33 times the diaphragm thickness, usable resonators exist for IDT pitch values within ranges of 2.8 to 3.6 times the diaphragm thickness, 5.0 to 6.8 times the diaphragm thickness, and 8.7 to 10.2 times the diaphragm thickness. These ranges are progressively wider for thinner IDT conductors. For IDT conductor thickness less than or equal to 0.225 times the diaphragm thickness, usable resonators exist for IDT pitch values within ranges of 2.8 to 3.9 times the diaphragm thickness, 5.0 to 6.9 times the diaphragm thickness, and 8.3 to 10.3 times the diaphragm thickness. For IDT conductor thickness less than or equal to 0.14 times the diaphragm thickness, usable resonators exist for IDT pitch values within ranges of 2.8 to 4.0 times the diaphragm thickness, 5.0 to 7.2 times the diaphragm thickness, and 8.2 to 10.6 times the diaphragm thickness.

Figure 8:
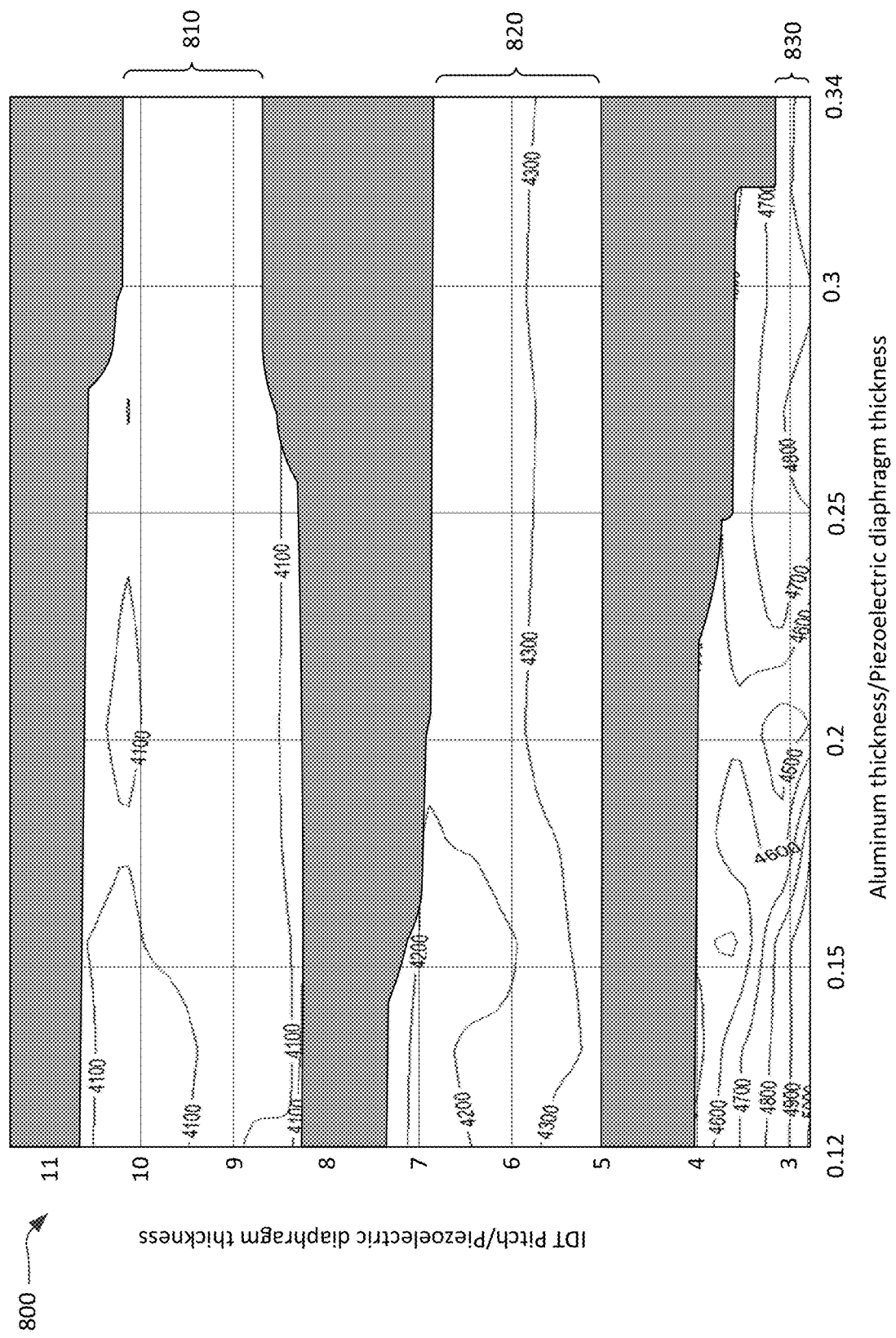
FIG. 8 is graph of resonance frequency as a function of IDT thickness and IDT pitch.

FIG. 8 is a graph 800 of XBAR resonance frequency as a function of IDT pitch and IDT finger thickness. The labeled contour lines indicate the resonance frequency of XBARs with 440 nm thick lithium niobate diaphragm, aluminum conductors, no dielectric tuning layer, and a typical passivation layer. The erratic shapes of some of the contour lines are due to spurious modes passing near the resonance frequency. This graph is based on two-dimensional simulation using a finite element method.

XBARs with IDT pitch/diaphragm thickness within unshaded regions 810, 820, 830 (which correspond to the unshaded regions 710, 720, 730 of FIG. 7) are likely to have sufficiently low spurious effects for use in filters. XBARs with IDT pitch and thickness within the intervening shaded regions have unacceptably high spurious modes for use in the target filter. FIG. 8 illustrates that, for XBAR resonators with thin IDT electrodes, it is possible to tune the resonance frequency of over a range of more than 15% using the pitch of the IDT fingers. For example, the resonance frequency of an XBAR with a 440 nm diaphragm thickness can be set between about 4100 MHz to more than 4800 MHz by varying the IDT pitch.

The separation between the resonance and anti-resonance frequencies of an acoustic resonator is determined by the electromechanical coupling factor Γ (gamma), which is dependent on the pitch of the IDT. Gamma is a metric defined by the equation:

$$\Gamma = \frac{1}{(Fa/Fr)^2 - 1}$$

where Fa is the antiresonance frequency and Fr is the resonance frequency. Large values for gamma correspond to smaller separation between the resonance and anti-resonance frequencies. Low values of gamma indicate larger separation between the resonance and anti-resonance frequencies, which is good for wideband ladder filters.

Figure 9:
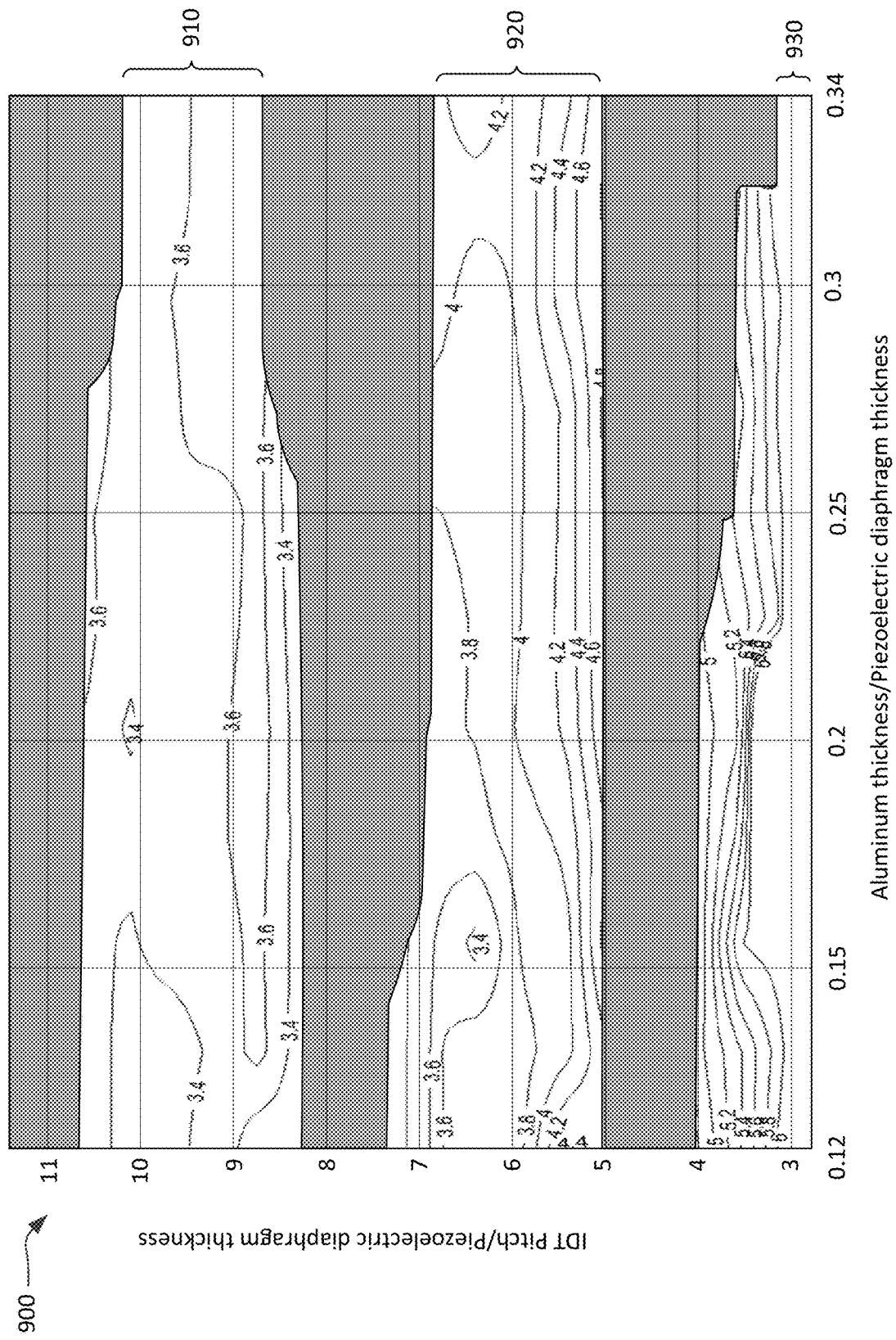
FIG. 9 is graph of coupling factor Γ as a function of IDT thickness and IDT pitch.

FIG. 9 is a graph 900 of electromechanical coupling factor Γ as a function of IDT pitch and IDT finger thickness. The labeled contour lines indicate the Γ of XBARs with 440 nm thick lithium niobate diaphragm, aluminum conductors, no dielectric tuning layer, and a typical passivation layer. The erratic shapes of some of the contour lines are due to spurious modes passing near the resonance or anti-resonance frequencies. This graph is based on two-dimensional simulation using a finite element method.

XBARs with IDT pitch/diaphragm thickness within unshaded regions 910, 920, 930 (which correspond to the unshaded regions 710, 720, 730 of FIG. 7) are likely to have sufficiently low spurious effects for use in filters. XBARs with IDT pitch and thickness within the intervening shaded regions have unacceptably high spurious modes for use in the target filter. XBARs with IDT pitch/diaphragm thickness within unshaded region 910 have Γ of 3.6 or less. XBARs with IDT pitch/diaphragm thickness within unshaded region 920 have Γ between 3.8 and 4.6. XBARs with IDT pitch/diaphragm thickness within unshaded region 930 have Γ equal to or greater than 5.0.

XBARs with thin aluminum conductors can be tuned using IDT pitch over a tuning range of more than 15%. Such XBARs will have Γ less than 3.6 at the lower frequency end of this tuning range and Γ about 6.5 at the upper end of the tuning range. These resonator characteristics are sufficient for to implement a variety of bandpass filter applications, including filters with 15% or larger bandwidth, without the inclusion of a dielectric frequency setting layer. Such filters may have none, one, or more dielectric layers deposited over all of the IDTs and diaphragms. Prior to tuning, the total deposited thickness of the dielectrics layers is the same for all resonators. The dielectric layer(s) may be or include a passivation and tuning layer as previously described.

Figure 10:
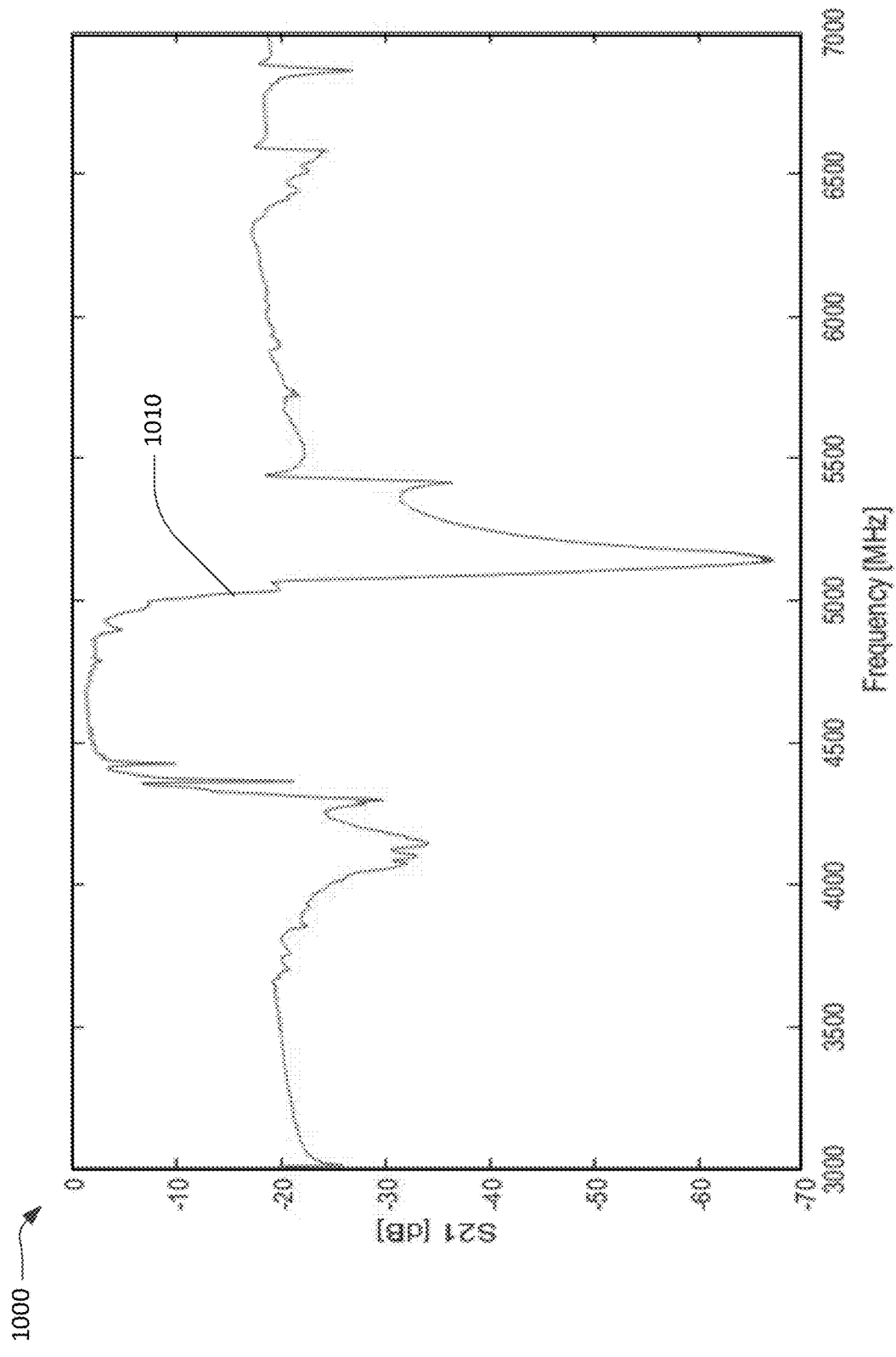
FIG. 10 is a graph of input-output transfer function (S21) versus frequency for a filter using XBARs with thin aluminum IDT conductors and without a frequency-setting dielectric layer.

FIG. 10 is a graph 1000 of the measured input-output transfer function (S21) of an initial experimental filter using five XBAR devices as described previously. Specifically, the line 1010 is a plot of the magnitude of S21 as a function of frequency. This experimental filter is not intended to meet the requirements of any particular communications band. The center of the pass band is 4665 MHz and the −3 dB bandwidth is 440 MHz. Further optimization of the filter design may result in improvements such as increased bandwidth, reduced insertion loss in the passband, increased attenuation outside of the pass band, and reduced spurious effects.

Description of Methods

Figure 11:
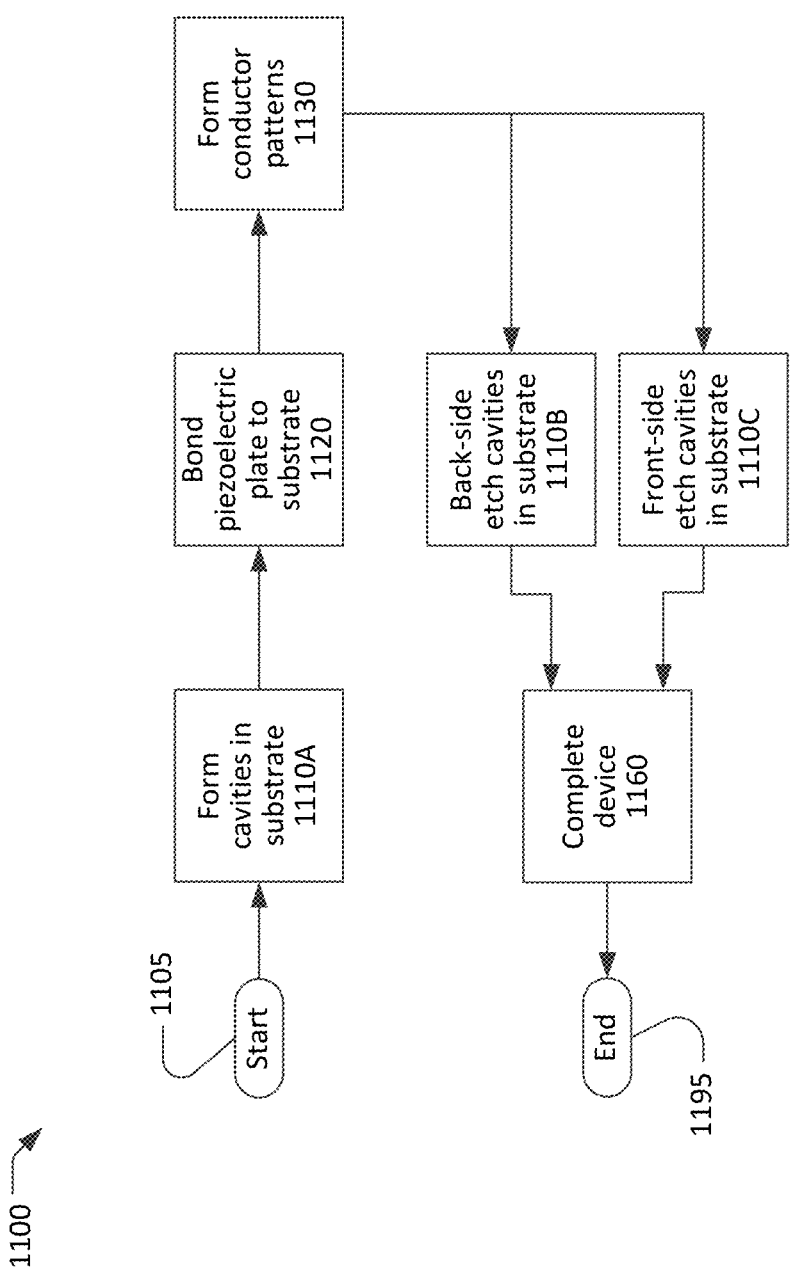
FIG. 11 is a flow chart of a process for fabricating an acoustic resonator filter without frequency-setting dielectric layers.

FIG. 11 is a simplified flow chart showing a process 1100 for making an XBAR or a filter incorporating XBARs. The process 1100 starts at 1105 with a substrate and a plate of piezoelectric material and ends at 1195 with a completed XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

The flow chart of FIG. 11 captures three variations of the process 1100 for making an XBAR which differ in when and how cavities are formed in the substrate. The cavities may be formed at steps 1110A, 1110B, or 1110C. Only one of these steps is performed in each of the three variations of the process 1100.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 1100, one or more cavities are formed in the substrate at 1110A before the piezoelectric plate is bonded to the substrate at 1120. A separate cavity may be formed for each resonator in a filter device. The one or more cavities may be formed using conventional photolithographic and etching techniques. Typically, the cavities formed at 1110A will not penetrate through the substrate, and the resulting resonator devices will have a cross-section as shown in FIG. 3.

At 1120, the piezoelectric plate is bonded to the substrate. The piezoelectric plate and the substrate may be bonded by a wafer bonding process. Typically, the mating surfaces of the substrate and the piezoelectric plate are highly polished.

One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1130 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1130 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1130 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

In a second variation of the process 1100, one or more cavities are formed in the back side of the substrate at 1110B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In a third variation of the process 1100, one or more cavities in the form of recesses in the substrate may be formed at 1110C by etching the substrate using an etchant introduced through openings in the piezoelectric plate. A separate cavity may be formed for each resonator in a filter device. The one or more cavities formed at 1110C will not penetrate through the substrate, and the resulting resonator devices will have a cross-section as shown in FIG. 3.

In all variations of the process 1100, the filter device is completed at 1160. Actions that may occur at 1160 include depositing a passivation and tuning layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Any dielectric layer deposited at 1160 or elsewhere in the process 1100 is deposited over all resonators. Another action that may occur at 1160 is to tune the resonant frequencies of the resonators within the device by adding or removing metal or dielectric material from the front side of the device. After the filter device is completed, the process ends at 1195.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic filter device comprising:
    a substrate having a surface;
    a lithium niobate piezoelectric plate having front and back surfaces and a thickness ts, the back surface attached to the surface of the substrate except for portions of the lithium niobate piezoelectric plate forming a plurality of diaphragms that span respective cavities in the substrate;
    a conductor pattern formed on the front surface of the lithium niobate piezoelectric plate, the conductor pattern comprising a plurality of interdigital transducers (IDTs) of a plurality of acoustic resonators, interleaved fingers of each IDT of the plurality of IDTs disposed on a respective diaphragm of the plurality of diaphragms; and
    one or more dielectric layers deposited over all of the plurality of IDTs and the plurality of diaphragms, wherein a total deposited thickness of the one or more dielectric layers is the same for all of the plurality of acoustic resonators, wherein
    the interleaved fingers of all of the plurality of IDTs are aluminum with a common thickness tm, where 0.12 ts<tm<0.32 ts, and
    each IDT of the plurality of IDTs has a respective pitch p within one of following ranges: 2.8 ts to 4.0 ts, 5.0 ts to 7.2 ts, and 8.2 ts to 10.6 ts.

2. The device of claim 1, wherein
    the one or more dielectric layers comprises a passivation/tuning layer.

3. The device of claim 1, wherein
the one or more dielectric layers consists of a passivation/tuning layer.

4. The device of claim 1, wherein, for each IDT of the plurality of IDTs:
tm/ts and p/ts define a point within one of the unshaded areas defined in FIG. 7.

5. The device of claim 1, wherein the lithium niobate piezoelectric plate and the plurality of IDTs are configured such that respective radio frequency signals applied to the plurality of IDTs excite respective shear primary acoustic modes within the respective diaphragms.

6. The device of claim 1, wherein each diaphragm of the plurality of diaphragms is contiguous with the lithium niobate piezoelectric plate around at least 50% of a perimeter of the respective cavity.

7. A method of fabricating an acoustic filter device, comprising:
bonding a back surface of a lithium niobate piezoelectric plate to a surface of a substrate, portions of the lithium niobate piezoelectric plate forming a plurality of diaphragms that span respective cavities in the substrate;
forming a conductor pattern on a front surface of the lithium niobate piezoelectric plate, the conductor pattern comprising a plurality of interdigital transducers (IDTs) of a plurality of acoustic resonators, interleaved fingers of each IDT of the plurality of IDTs disposed on a respective diaphragm of the plurality of diaphragms; and
depositing one or more dielectric layers over all of the plurality of IDTs and the plurality of diaphragms, wherein a total deposited thickness of the one or more dielectric layers is the same for all of the plurality of acoustic resonators, wherein
the interleaved fingers of all of the plurality of IDTs are aluminum with a common thickness tm, where 0.12 ts<tm<0.32 ts, and
each IDT of the plurality of IDTs has a respective pitch p within one of following ranges: 2.8 ts to 4.0 ts, 5.0 ts to 7.2 ts, and 8.2 ts to 10.6 ts.

8. The method of claim 7, wherein
depositing the one or more dielectric layers comprises depositing a passivation/tuning layer.

9. The method of claim 7, wherein
depositing the one or more dielectric layers consists of a depositing a passivation/tuning layer.

10. The method of claim 7, wherein, for each IDT of the plurality of IDTs:
tm/ts and p/ts define a point within one of the unshaded areas defined in FIG. 7.

11. The method of claim 7, wherein the lithium niobate piezoelectric plate and the plurality of IDTs are configured such that respective radio frequency signals applied to the IDTs excite respective shear primary acoustic modes within the respective diaphragms.

12. The method of claim 7, wherein each diaphragm of the plurality of diaphragms is contiguous with the piezoelectric plate around at least 50% of a perimeter of the respective cavity.

13. An acoustic resonator device comprising:
a substrate having a surface;
a lithium niobate piezoelectric plate having front and back surfaces and a thickness ts, the back surface attached to the surface of the substrate except for a portion of the lithium niobate piezoelectric plate forming a diaphragm that spans a cavity in the substrate; and
an interdigital transducer (IDT) formed on the front surface of the lithium niobate piezoelectric plate with interleaved fingers of the IDT disposed on the diaphragm, wherein
the interleaved fingers are aluminum with a thickness tm, where 0.12 ts≤tm≤0.32 ts, and
a pitch p of the interleaved fingers falls within one of the following ranges: 2.8 ts to 4.0 ts, 5.0 ts to 7.2 ts, and 8.2 ts to 10.6 ts.

14. The device of claim 13, wherein the single crystal piezoelectric plate and the IDT are configured such that a radio frequency signal applied to the IDT excites a shear primary acoustic mode within the diaphragm.

15. The device of claim 13, wherein the diaphragm is contiguous with the piezoelectric plate around at least 50% of a perimeter of the cavity.

16. The device of claim 13, wherein
tm/ts and p/ts define a point within one of the unshaded areas defined in FIG. 7.

17. The device of claim 13, further comprising a dielectric passivation/tuning layer deposited over the IDT and the front side of the piezoelectric plate.

* * * * *